United States Patent [19]

Adams

[11] Patent Number: 5,420,585
[45] Date of Patent: May 30, 1995

[54] DIGITAL TO ANALOG CONVERSION DEVICES

[75] Inventor: Guy d. W. B. Adams, Stroud, Great Britain

[73] Assignee: Peter Qvortrup, Sussex, United Kingdom; a part interest

[21] Appl. No.: 118,322

[22] Filed: Sep. 9, 1993

[30] Foreign Application Priority Data

Sep. 9, 1992 [GB] United Kingdom ............... 9219099

[51] Int. Cl.⁶ .............................................. H03M 1/08
[52] U.S. Cl. .................... 341/118; 341/144; 333/176
[58] Field of Search ............... 341/118, 144; 333/167, 333/175–177

[56] References Cited

U.S. PATENT DOCUMENTS

| 3,579,154 | 5/1971 | Deen | 333/176 |
| 3,794,940 | 2/1974 | Dann | 333/177 |
| 4,363,009 | 12/1982 | Malcolm et al. | 333/177 |
| 4,734,652 | 3/1988 | Meza | 328/140 |
| 4,771,466 | 9/1988 | Modafferi | 381/99 |
| 4,816,830 | 3/1989 | Cooper | 341/153 |
| 4,973,915 | 11/1990 | Batey | 330/151 |
| 4,973,977 | 11/1990 | Hawkins et al. | 341/144 |
| 5,072,200 | 12/1991 | Ranky | 333/167 |
| 5,134,482 | 7/1992 | Brunnette et al. | 358/166 |

FOREIGN PATENT DOCUMENTS

| 1314449 | 4/1973 | United Kingdom . |
| 1576225 | 10/1980 | United Kingdom . |
| 2144285 | 2/1985 | United Kingdom . |
| 2166614 | 5/1986 | United Kingdom . |
| 2171568 | 8/1986 | United Kingdom . |

Primary Examiner—Marc S. Hoff
Attorney, Agent, or Firm—Young & Thompson

[57] ABSTRACT

A digital-to-analog conversion device for converting a digital signal to an analog signal for amplification by an audio amplifier. The conversion device has a solid state digital-to-analog converter and a filter connected to the output of the digital-to-analog converter. The filter comprises n passive components where n is a number of at least two, arranged so as to form an nth order filter for reducing the quantization of the output of the digital-to-analog converter.

10 Claims, 3 Drawing Sheets

DIGITAL TO ANALOG CONVERSION DEVICES

FIELD OF THE INVENTION

The invention relates to digital to analogue conversion devices.

DESCRIPTION OF THE RELATED ART

The actual analog output voltage of a conventional solid state digital-to-analog converter varies in discrete or quantized steps, rather than in a smooth and continuous manner. This effect is known as quantization, and occurs because the digital input to the digital-to-analog converter varies in quantized steps and the digital-to-analog converter can only produce an approximation to the required output. Quantization is particularly undesirable when the digital-to-analog converter is used in an audio system since it can be detected by the human ear. For this reason the output signals of digital-to-analog converters used in audio systems are conventionally fed through a series of operational amplifiers before being passed to an audio amplifier. The operational amplifiers are configured to reduce quantization by filtering the output of the digital-to-analog converter, and also perform other functions such as converting the current output of the digital-to-analog converter to a voltage signal, and amplifying the output signal. However, because operational amplifiers are solid state devices which have non-linear characteristics, they cause distortion of the output signal of the digital-to-analog converter. In particular, time domain distortion arises as a result of signals of different frequencies being delayed by different amounts by the semiconductor materials, parasitic elements, and feedback of the operational amplifiers. Such distortion can be detected by the human ear, and reduces the sound quality of the audio system.

The invention has arisen from attempts to overcome the above disadvantages of the prior art.

SUMMARY OF THE INVENTION

According to the invention there is provided a digital-to-analog conversion device for converting a digital signal to an analog signal for amplification by an audio amplifier, the conversion device comprising a solid state digital-to-analog converter and a filter connected to the output of the digital-to-analog converter, the filter comprising n passive components, where n is a number of at least two, arranged so as to form an nth order filter for reducing the quantization of the output of the digital-to-analog converter.

It will be appreciated that because the passive components behave in substantially a linear manner, they are particularly effective in filtering the output of the digital-to-analog converter so as to remove quantization from the output signal.

Preferably, if n is equal to two, the filter comprises an inductor arranged in series and a capacitor arranged in parallel.

Preferably, if n is equal to three, the filter comprises two inductors and a capacitor arranged in a T-section, the two inductors being connected in series.

Alternatively, if n is greater than three and also an odd number, the filter preferably comprises $(n+1)/2$ inductors arranged in series, and $(n-1)/2$ capacitors arranged in parallel, each capacitor being connected between a different pair of adjacent inductors so as to form a ladder network.

Alternatively, if n is greater than two and also an even number, the filter preferably comprises $n/2$ inductors arranged in series, and $n/2$ capacitors arranged in parallel, the capacitors and inductors being arranged so as to form a ladder network.

Preferably, the conversion device further comprises a load resistor arranged in parallel at the output end of the filter.

Ideally, the filter is a linear phase type filter of nth order.

The filter may be a Bessel type filter or a Butterworth type filter of nth order, or an approximation of these two types of filter.

Advantageously, the conversion device further comprises an impedance matching transformer arranged between the output of the digital-to-analog converter and the input of the filter.

Alternatively, the conversion device may simply comprise an input resistor arranged in parallel at the input end of the filter for converting the current output of the digital-to-analog converter to a voltage.

In this case, a further capacitor may be arranged in series between the output of the digital-to-analog converter and the input resistor in order to prevent any net d.c. current flow between the output of the digital-to-analog converter and the input of the filter.

In any of the above arrangements, the conversion device may further comprise an amplifier connected to the output of the filter to ensure that the output of the conversion device is compatible with the audio amplifier.

In this case, the amplifier may be a solid state amplifier, such as an operational amplifier or discrete amplifier.

The invention also provides an audio system comprising a digital-to-analog conversion device as described above, and an audio amplifier, the input of the audio amplifier being connected to the output of the digital-to-analog conversion device.

The invention will now be more particularly described, by way of example only, with reference to the accompanying drawings.

DESCRIPTION OF THE PREFERRED EMBODIMENT

Figure 1:
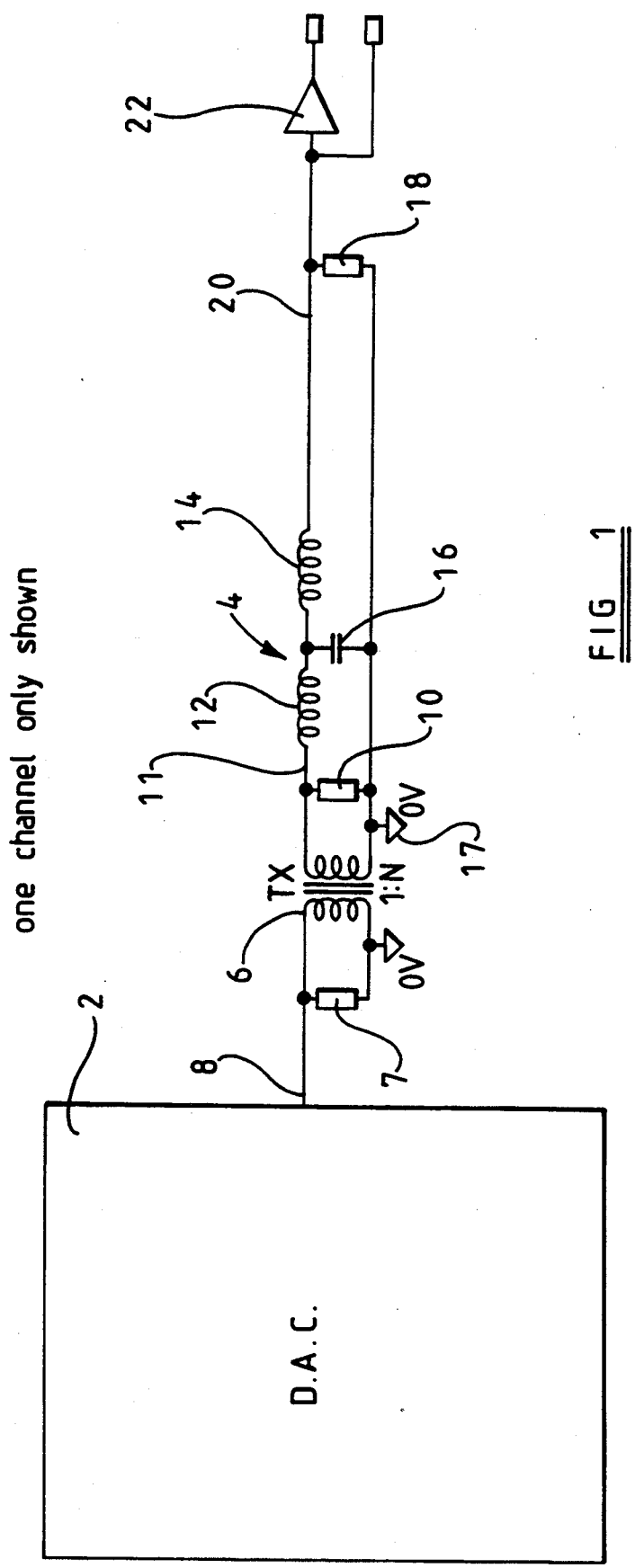
FIG. 1 shows a digital-to-analog conversion device in accordance with a first embodiment of the invention.

The digital-to-analogue conversion device 1 of FIG. 1 comprises a conventional integrated circuit digital-to-analog converter 2, such as that sold under the identification number "PCM 63P" by Burr Brown, connected to a linear phase filter 4 by means of an impedance matching transformer 6.

The impedance matching transformer 6 comprises a transformer input resistor 7 having a resistance of about 2.2 KΩ, and converts the current output 8 of the digital-to-analog converter 2 to a voltage which is applied across a transformer output resistor 10, having a resistance of about 600 Ω, arranged at the input end 11 of the filter 4. The input impedance of the impedance matching filter 6 may be of the order of 100 Ω.

The voltage applied across the transformer output resistor 10 is filtered by means of the linear phase filter 4 which comprises two inductors 12 and 14 having inductances of about 32.9 mH and 12.3 mH respectively, and a capacitor 16 having a capacitance of 440 pF. The two inductors 12 and 14 are arranged in series with each other, and the capacitor 16 is arranged in parallel with the transformer output resistor 10, and connected between the two inductors 12 and 14. The parallel components are all grounded at one terminal, as shown by the symbol labelled 17 in FIG. 1.

A load resistor 18, having a resistance of about 7.5 kΩ, is arranged in parallel with the capacitor 16 at the output end 20 of the filter 4. The output from the filter 4 is fed to a suitable audio amplifier (not shown) via an optional amplifier 22 which may be a solid state amplifier, such as an operational amplifier, or any other suitable form of amplifier including a valve amplifier.

It will be appreciated that the passive components 12, 14 and 16 have substantially linear characteristics and are therefore able to filter the output signal of the digital-to-analog converter 2 without causing time domain distortion to the output signal, which arises in conventional arrangements which use solid state devices to filter the output signal of the digital-to-analog converter.

Figure 2:
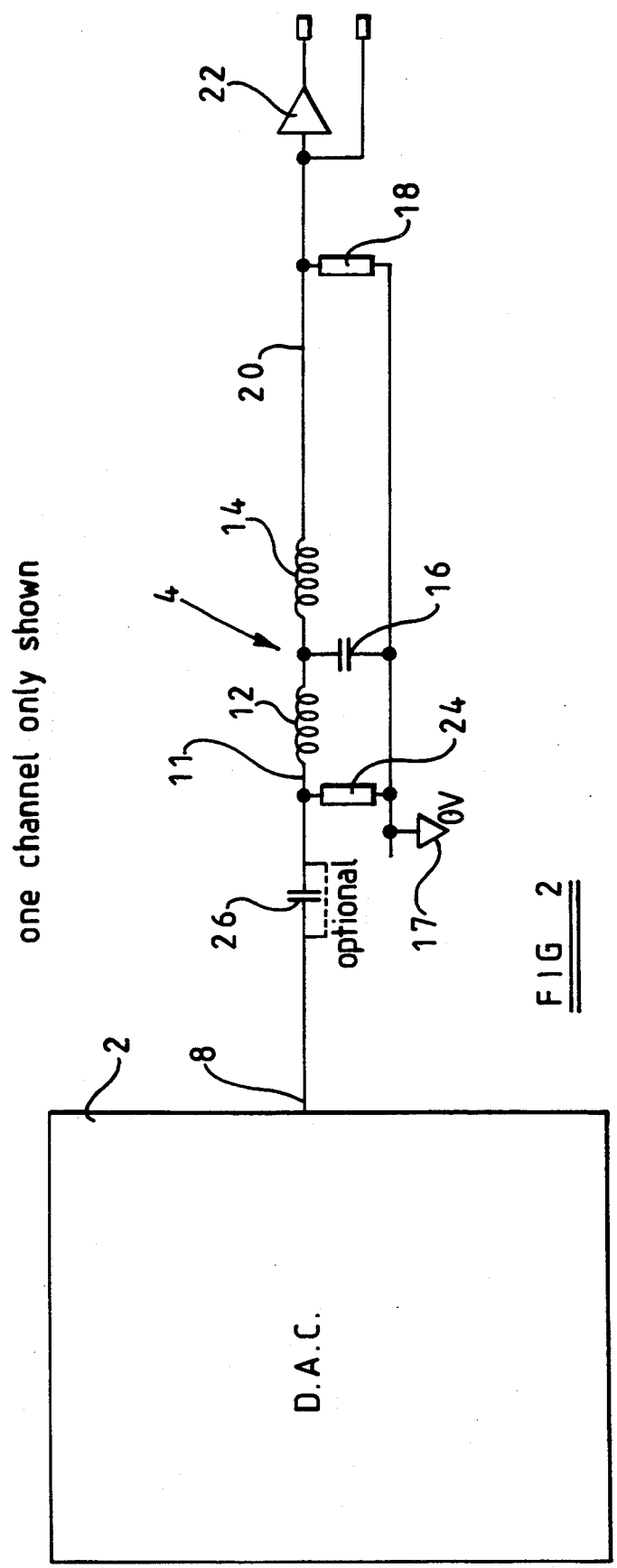
FIG. 2 shows a simpler digital-to-analog conversion device in accordance with a second embodiment of the invention.

The digital-to-analog conversion device shown in FIG. 2 is the same as that shown in FIG. 1 except that the impedance matching transformer 6 is replaced by a simple resistor 24 having a resistance of about 150Ω. The resistor 24 converts the current output 8 of the digital-to-analog converter to a voltage signal, and provides a cheaper alternative to the impedance matching transformer 6. In order to prevent any net d.c. current flow between the digital-to-analogue converter 6 and the filter 4, the resistor 24 is connected to the digital-to-analog converter 6 by means of a small capacitor 26.

Figure 3:
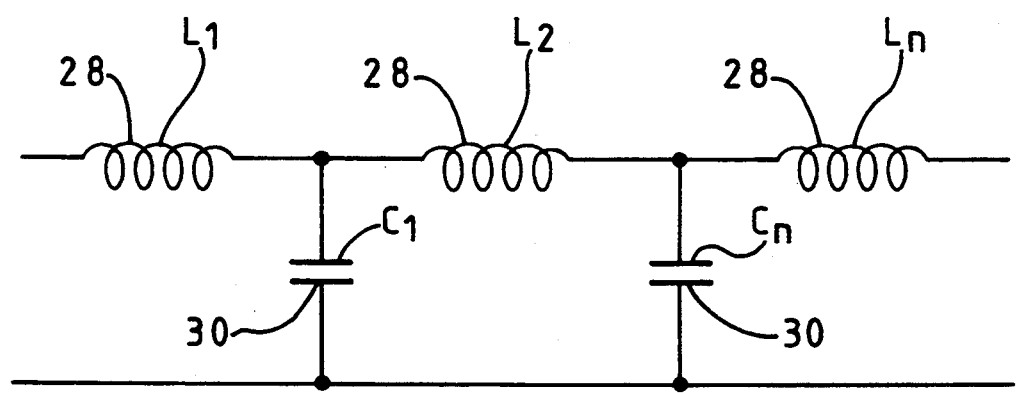
FIG. 3 shows how the linear phase filter of FIGS. 1 and 2 can be extended to include passive components arranged in a ladder network.

FIG. 3 shows how the linear phase filter 4 used in the above embodiments can be extended to include n passive components arranged in a ladder network. In the general case, the filter 4 comprises (n+1)/2 inductors 28 arranged in series, and (n−1)/2 capacitors 30 arranged in parallel, each capacitor 30 being connected between a different pair of adjacent inductors 28.

Modifications of the invention herein disclosed will occur to a person skilled in the art and all such modifications are deemed to be within the scope of this invention as defined by the appended claims.

What we claim is:

1. A digital-to-analog conversion device for converting a digital signal to an analog audio frequency signal for amplification by an audio amplifier, comprising:
   a solid state digital-to-analog converter;
   an impedance matching transformer having an input connected to an output of said digital-to-analog converter;
   a filter connected to an output of said impedance matching transformer, said filter comprising n passive components, where n is a number of at least two, arranged so as to form an nth order filter for reducing the quantization of the output of the digital-to-analog converter; and
   an input of said audio amplifier being connected to an output of said digital-to-analog conversion device.

2. A conversion device as claimed in claim 1, wherein n is equal to two and the filter comprises an inductor arranged in series and a capacitor arranged in parallel.

3. A conversion device as claimed in claim 1, wherein n is equal to three and the filter comprises two inductors and a capacitor arranged in a T-section, the two inductors being connected in series.

4. A conversion device as claimed in claim 1, wherein n is greater than three and also an odd number and the filter comprises (n+1)/2 inductors arranged in series and (n−1)/2 capacitors arranged in parallel, each capacitor being connected between a different pair of adjacent inductors so as to form a ladder network.

5. A conversion device as claimed in claim 1, wherein n is greater than two and also an even number and the filter comprises n/2 inductors arranged in series and n/2 capacitors arranged in parallel, the capacitors and inductors being arranged so as to form a ladder network.

6. A conversion device as claimed in claim 1, further comprising a load resistor arranged in parallel at the output end of the filter.

7. A conversion device as claimed in claim 1, wherein the filter is a linear phase type nth order filter.

8. A conversion device as claimed in claim 1, further comprising an input resistor arranged in parallel at the input end of the filter for converting the current output of the digital-to-analog converter to a voltage.

9. A conversion device as claimed in claim 7, wherein a further capacitor is arranged in series between the output of the digital-to-analog converter and the input resistor.

10. A conversion device as claimed in claim 1, further comprising an amplifier connected to the output of the filter.

* * * * *